US006529021B1

(12) United States Patent
Yu et al.

(10) Patent No.: US 6,529,021 B1
(45) Date of Patent: Mar. 4, 2003

(54) SELF-SCRUB BUCKLING BEAM PROBE

(75) Inventors: Yuet-Ying Yu, Hopewell Junction, NY (US); Daniel G Berger, Wappingers Falls, NY (US); Camille Proietti Bowne, Poughkeepsie, NY (US); Scott Langenthal, Pleasant Valley, NY (US); Charles H Perry, Poughkeepsie, NY (US); Terence Spoor, Marlboro, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/558,428

(22) Filed: Apr. 25, 2000

(51) Int. Cl.[7] .............................................. G01R 1/067
(52) U.S. Cl. ..................... 324/754; 324/158.1; 439/482
(58) Field of Search ............................. 324/761, 158.1, 324/754; 439/482

(56) References Cited

U.S. PATENT DOCUMENTS

| 4,027,935 A |   | 6/1977  | Byrnes et al. |         |
|-------------|---|---------|---------------|---------|
| 4,423,376 A |   | 12/1983 | Byrnes et al. |         |
| 5,225,777 A | * | 7/1993  | Bross et al.  | 324/158.1 |
| 5,952,843 A | * | 9/1999  | Vinh          | 324/761 |

OTHER PUBLICATIONS

Probing Considerations in C–4 Testing of IC Wafers The International Journal of Microcircuits and Electronic Packaging, vol. 15, No. 4, Fourth Quarter 1992 (ISSN 1063–1674) pp. 229–238.

* cited by examiner

Primary Examiner—Safet Metjahic
Assistant Examiner—Jimmy Nguyen
(74) Attorney, Agent, or Firm—H. Daniel Schnurmann

(57) ABSTRACT

A self scrubbing buckling beam contactor for contacting an array of pads positioned on a device under test is described. The contactor consists of three insulating dies: a top, an offset and a lower die separated from each other by an insulated spacer of variable thickness. Each die is provided with holes. The buckling beam has an array of flexible wires positioned substantially perpendicular to the dies, each of the flexible wires crossing a corresponding hole in each of the top, offset and lower dies to allow each wire respectively contact a pad of the device under test. By shifting the center of the hole of the lower die relative to the center of the offset die, the tip of the wire exits from the lower die at an angle with respect to the plane formed by the pads of the device under test. The exit angle of the wire tip is controlled by the relative displacement of the offset die relative to the bottom die, such that the exit angle of the tip of the wire at the bottom die changes when the probe wire is under compression. By applying a reciprocating motion to the tip of the wire contacting the surface of the device under test, a scrubbing motion is achieved that lowers the resistance between the pad of the device under test. In this manner, the tip of the wire cleans the surface of the pads and prevents contaminants from adhering to the tip of the wire.

16 Claims, 4 Drawing Sheets

SELF-SCRUB BUCKLING BEAM PROBE

FIELD OF THE INVENTION

This invention is related to a probe contactor having a plurality of buckling beams, and more particularly to a probe provided with self-scrubbing features such that when a force is applied to the probe, the tip of the probe changes its landing angle, providing a controlled scrub by wiping action.

BACKGROUND OF THE INVENTION

Present trends in the microelectronic industry portend ever increasing chip densities, which translate in the need for new probing devices to accommodate the increase in the number of I/O pads.

When testing the electrical characteristics of an integrated circuit, whether a chip, module, and the like, the probes of a contactor engage the pads of the package under test to provide an electric path from the device under test to the tester. Accordingly, it is imperative to ensure that the probes contacting the pads be endowed with a controlled force to prevent or at the least, reduce, any damage to the pads. Oftentimes, excessive force exerted by the probe on the pad, particularly when dealing with a chip, can destroy the pad altogether, requiring the additional step of having to reconstruct the pad in question by way of techniques known as solder reflow.

Present art probes include etched lead frame cantilever contacts, which are highly versatile and which are mainly used for peripheral footprints. With the advent of more complex footprints, commercial cantilever contactors became more prevalent. These contactors are characterized in that a popout card is plugged into a motherboard. The contacts of such devices typically take the form of discrete wires extending outwardly and secured around the periphery. The distinct advantage of such probes is its ability of serving the dual purpose of acting as a space transformer with the motherboard acting as a mounting platform for the desired discrete components.

Cantilever probes are oftentimes provided with several layers of contacts in order to adapt such contactors to pads in an array formation. Such probes with more than one layer are difficult to design, specifically having a plurality of probe tips to be coplanar for allowing contact to all the pads of an array with equal force. Even when multiple layers of probes are used, it is still difficult to physically position them without they interfering with each other.

The aforementioned commercial cantilever contactors were followed by custom probes, particularly useful for array footprint, become prevalent in view of their ability of incorporating a vertical acting motion. Both types, the cantilever contactors and custom probes provided electrical contact coupled to a spring action that proved highly beneficial to account for product height variations. More details can be found in an article published by the International Journal of Microelectronics and Electronic Packaging, Vol. 15, No. 4, Fourth Quarter 1992 (ISSN 1063-1674), pp. 229–238, entitled "Probing considerations in C-4 Testing of IC wafers".

A prior art buckling beam contactor is shown in FIG. 1. It consists mainly of a housing, insulating dies with an area array of holes, and an array of contacts or wires. These contacts employ the principal of a buckling column whereby the application of a force beyond the critical force causes buckling to occur. Contact lengths are 16.6 mm for 0.10 mm diameter contacts. Contacts are made of paladium allow and are coated with insulating parylene. They further have swages head which interfaces with gold pads on the footprint transformer. The upper and lower dies provide both location and bearing surfaces. The offset die provides both bias prebuckle and vertical retention. The contacts traverse all three dies using holes that are aligned with respect to each other and which are positioned to coincide with the footprint of the device under test.

In present day probes contactors, deflection of a probe is proportional to the amount of force exerted on the probe. This is particularly true since conventional probes are designed for only vertical motion, to a point that these probes are oftentimes referred to as vertical probing technology.

Another type of buckling beam extensively used in the industry and known as a Cobra probe, is characterized as a hybrid type of buckling beam. The housing, insulating dies with an area array of holes, and the array of wires, are the same as those previously described with reference to FIG. 1. The Cobra probe differs in the design of the contact or wire. The wire is best described as a hinged-offset hybrid column, typically 6.4 mm in length and using a 0.13 mm Paliney 7 wire. The main difference resides in the wire being flattened and precurved to form what is known as the active portion of the contact. The head is swagged at 90 degrees with respect to the active portion. Conventional Cobra probes do not have an offset die, with the lower die being displaced with respect to the fixed upper die by 1.3 to 1.9 mm. The contact shank rides essentially vertically in the lower die. A limited amount of wiping (scrubbing) of the pads of the device under test is achievable, although the construction of the Cobra probe precludes an effective wiping action which is essential to establish good contact with the pads because of its characteristic low inertia and vertical retention.

The problem associated with vertical only movement probe is that when probing is performed on Al pads, as typically found in semiconductor wafers, the probe does not easily penetrate and push off the oxide layer on the pad, resulting in a high and unstable contact resistance.

Related patents are:

U.S. Pat. No. 4,027,935, Contact for an electrical contactor assembly, issued to H. P. Byrnes et al., and of common assignee; and U.S. Pat. No. 4,423,376, to H. P. Byrnes et al., Contact probe assembly having rotatable contacting probe elements, and of common assignee.

OBJECTS OF THE INVENTION

Accordingly, it is an object of the present invention to provide a buckling beam probe, wherein after a critical buckling point, the probe force remains constant.

It is another object of the invention to provide a buckling beam probe having the benefits of a cantilever probe, i.e., by providing scrub action while probing.

It is yet another object of the invention to provide a buckling beam wherein the scrubbing direction and scrub length can be accurately controlled by design, independent of the amount of compression, thereby allowing the level of the device under test relative to the probe head, and the amount of probe compression to be controlled precisely by the test system.

It is still another object of the invention to provide a shifty self-scrub design, wherein the scrub direction changes during testing, such that under no load, the tip points to the right which is set by the shift of the bottom plate, and when the probe is under load, the tip scrubs to the left, which is set by the offset guide plate.

It is a further object of the invention to provide a probe beam using straight wire materials which are not highly ductile, e.g., tungsten, as opposed to a Cobra probe which body is normally flat, pre-bowed shape and wherein the probe head is normally coined or formed to a ball shape.

It is still a further object of the invention to provide a probe beam which can be easily repaired and wherein individual probe beams can be replaced without removing guide plates, thereby dispenses the need for a probe tip alignment after replacing the beam.

SUMMARY OF THE INVENTION

In a first aspect of the invention, there is provided a buckling beam contactor for contacting an array of pads positioned on a device under test that includes: a top, an offset and a lower insulating die, each of the insulating dies being provided with holes, each of the dies being separated from the next die by an insulated spacer of variable thickness; and an array of flexible wires positioned substantially perpendicular to the dies, each of the flexible wires crossing a corresponding hole in each of the top, offset and lower dies to allow each wire respectively contact a pad of the device under test, wherein by shifting the center of the hole of the lower die relative to the center of the offset die, the tip of the wire exits from the lower die at an angle with respect to the plane formed by the pads of the device under test.

In a second aspect of the invention, there is provided a method of providing of contacting an array of pads positioned on a device under test by way of a buckling beam contactor, the method including the steps of: supplying a top, an offset and a lower insulating die, each of the insulating dies being supplied with holes, each of the dies being separated from the next die by an insulated spacer of variable thickness; and providing an array of flexible wires positioned substantially perpendicular to the dies, each of the flexible wires crossing a corresponding hole in each of the top, offset and lower dies to allow each wire respectively contact a pad of the device under test, wherein by shifting the center of the hole of the lower die relative to the center of the offset die, the tip of the wire exits from the lower die at an angle with respect to the plane formed by the pads of the device under test.

The exit angle of the wire tip is controlled by the relative displacement of the offset die relative to the bottom die, such that the exit angle of the tip of the wire at the bottom die changes when the probe wire is under compression.

When a reciprocating motion to the tip of the wire is applied when the wires contact the surface of the device under test, a scrubbing motion is achieved that lowers the resistance between the pad of the device under test. In this manner, the tip of the wire cleans the surface of the pads and prevents contaminants from adhering to the tip of the wire.

BRIEF DESCRIPTION OF THE DRAWINGS

The foregoing and other aspects, objects and advantages of the invention will be better understood from the following description of a preferred embodiment of the invention when taken in conjunction with the accompanying drawings.

DETAILED DESCRIPTION OF A PREFERRED EMBODIMENT OF THE INVENTION

Figure 1:
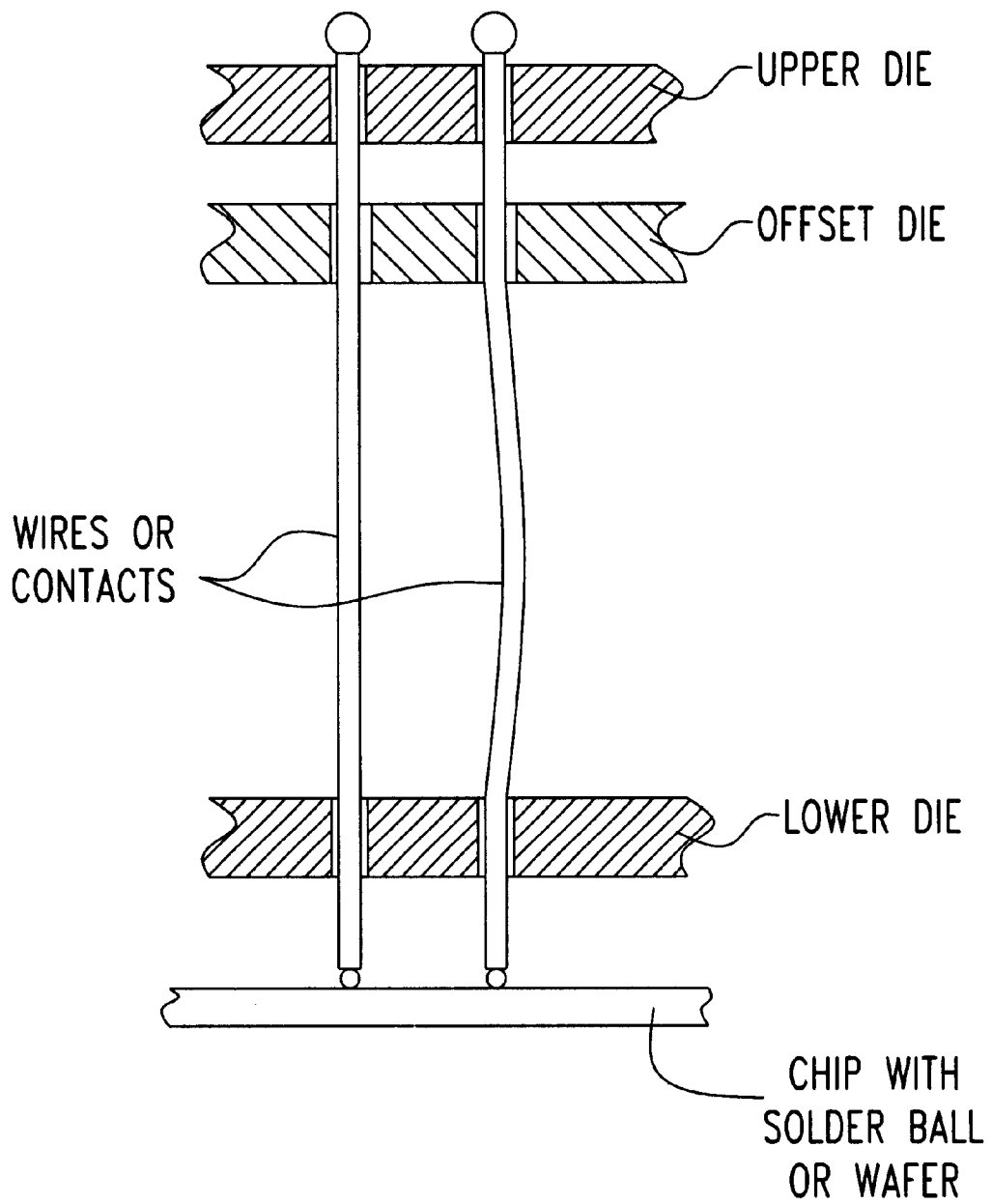
FIG. 1 shows a prior buckling beam contactor, depicting the alignment of the holes in the upper, offset and lower dies.
Figure 2:
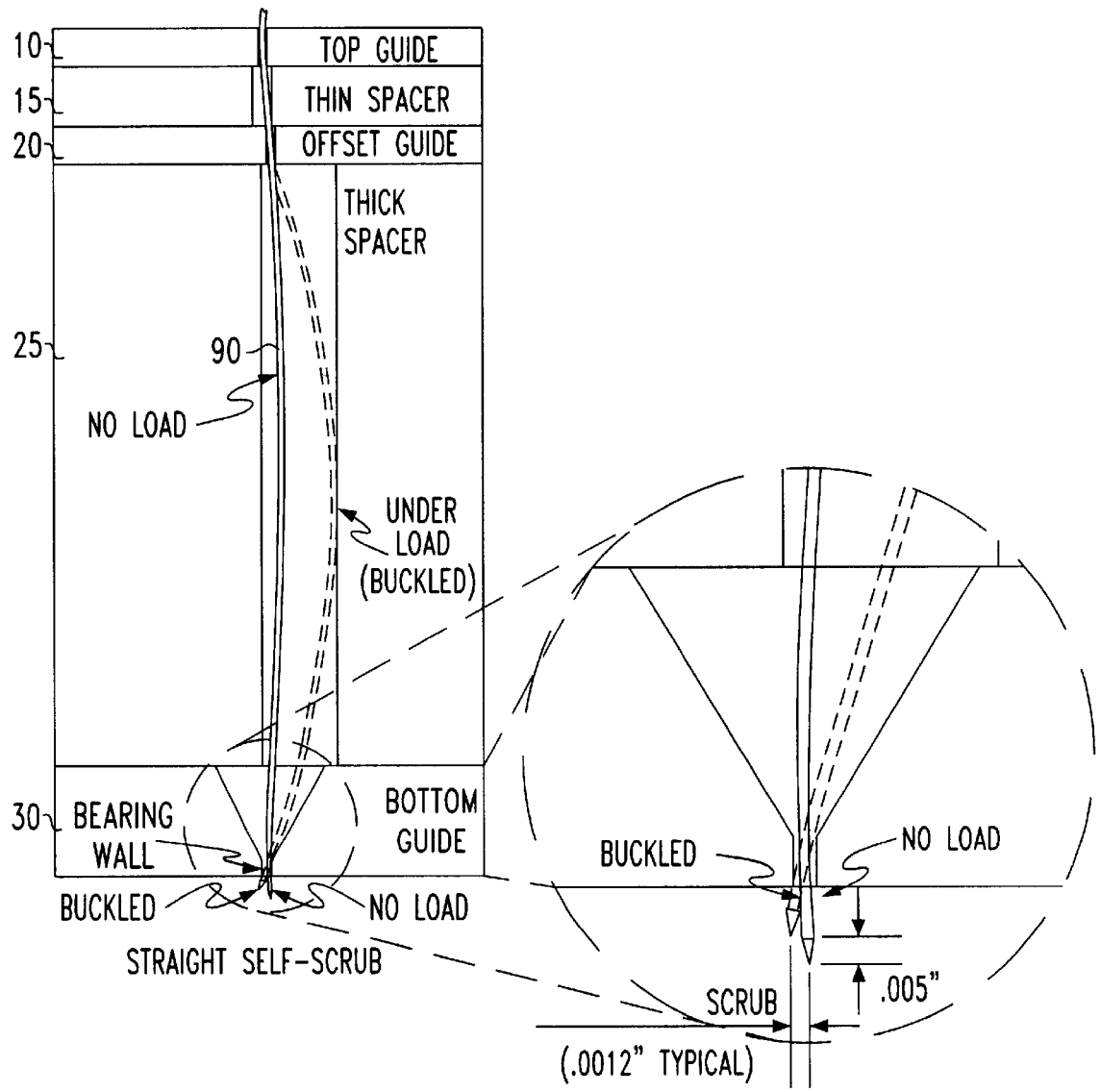
FIG. 2 is a schematic diagram showing a side view of a straight self-scrub buckling beam and an exploded view of its tip, in accordance with the present invention.

Referring now to the drawings, and more particularly to FIG. 2, there is shown a side view of a straight self-scrub buckling beam and an exploded view of its tip, in accordance with the invention. The beam is shown both, in a no load state as well as under compressive stress, to be referred hereinafter as a buckled beam.

An array of electrically conductive contacts made of thin straight wires 90 are held by three insulated guide plates. These are: a top guide plate (or die) 10, an offset guide plate 20 and a bottom guide plate 30. The guide plates are typically provided with an array of round holes having the same pitch as the footprint of the Device under Test (DUT). The diameter of the holes is slightly larger than those of the probe to allow a vertical displacement under load. The offset guide 20 hole pattern is offset by dowel pins in a predetermined direction, normally a few thousandths of an inch, in order to force the beam to buckle in a set direction. The guide plates are separated by spacers, more specifically, by a thin spacer 15 separating the top guide from the offset guide, allowing the probe wire to be offset at a low stress level, and by a thick spacer 25 separating the offset guide from the bottom guide. The thickness of the thick spacer is carefully calculated to achieve a certain buckling force and a certain probe tip 35 movement. The probe array assembly is normally used in combination with a footprint transformer (not shown) which is positioned above the top guide plate of the probe array assembly.

In order to determine the optimum buckling force for a beam probe having a single 'buckle' (i.e., the wire has only one curvature when the wire is under stress), and assuming a critical force of 12 grams on a probe having a diameter D of 2.5 mils (i.e., 0.0025"), for a buckling beam made of tungsten, the modulus of elasticity E of the probe material, also referred to as Young's modulus, is $58 \times 10^6$ psi. Thus, the moment of inertia I of the probe is given by the equation:

$$I = pD^4/64 = 3.1416(0.0025)^4/64 = 1.92 \times 10^{-12}$$

Since the critical force P that causes buckling of the wire (also referred to as slender rod) is obtained from the following equation:

$$P_{CR} = (Np^2EI)/I_{CR}^2,$$

the wire length is $$l^2 = Np^2EI/64/I_{CR}.$$

Let N be defined as a constant dependent of how the top and the bottom of the wire are fixed. It ranges between a fixed N=4 and a hinged N=2 condition. Assuming N=3, the value of the wire length I is I=0.353". This length determines how long the thick spacer should be for such a wire.

Assuming now that the (single buckle) buckling beam probe is made of beryllium-copper.

The critical force=10 gms for a probe having a diameter of 2.5 mils. The modulus of elasticity $E=19 \times 10^6$ psi. and $P_{CR}=10$ gms=0.022 lbs. Accordingly, $I=1.92 \times 10^{-12}$. Assuming once again N=3, then the length of the thick spacer I=0.220".

Practitioners of the art will readily appreciate the length of the thin spacers is only dependent on the offset, and thus do not need to be precisely calculated.

Still referring to FIG. 2, the construction of the guide plates is as follows: the offset guide hole is slightly offset to the right of the top guide hole to achieve a predetermined buckling direction. The bottom guide hole is in-line with the offset guide hole. The probe tip exit hole located on the bottom guide is slightly oversized and is characterized by a relatively short bearing wall (the slightly oversized exit hole herein creates space for the probe beam to move around slightly under buckling conditions). Experiments have shown that the bearing wall on the bottom plate should preferably be 250 microns high, which is rather short for a typical buckling beam probe construction. The dimensions of the oversized bottom plate hole and the height of the bearing wall vary in accordance with the desired probe scrub length. The greater the exit hole and the shorter of the bearing wall will allow the probe tip to exit at a bigger angle under buckling conditions and thus induce a longer probe scrub. When the tip is compressed by the DUT, the oversized exit hole and the thin bearing wall will induce the probe tip to skew to the left (i.e. pointing to the left is caused by the offset plate is positioned to the right of the top and bottom plate. This forces the probe beam body to buckle, bowing to the right. Hence the tip exits at an angle from the bottom plate, providing the desired wiping action.

Figure 3:
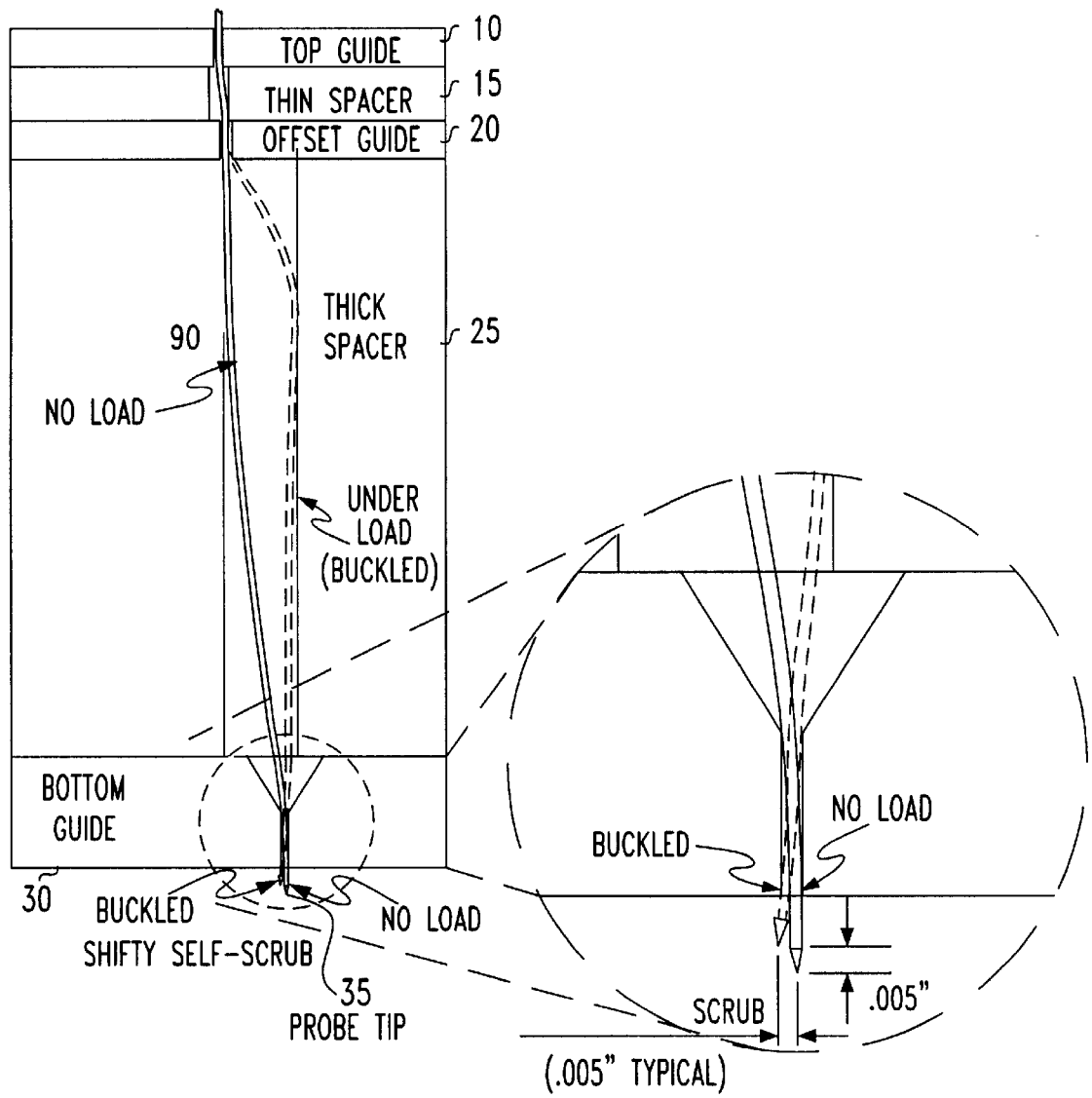
FIG. 3 schematic diagram of a shifty self-scrub buckling beam and an exploded view of its tip, according with the present invention.

Referring now to FIG. 3, showing a schematic diagram of a shifty self-scrub buckling beam, and an exploded view of its tip, the offset guide hole is slightly offset to the right of the top guide hole to create a predetermined buckling direction. This offset is of the order of 0.005" and is set to the right hand side of the top plate. The bottom guide hole is further offset to the right of the offset guide hole to force the probe tip to exit at an angle, (i.e., the probe tip cannot make a straight exit under this construction because the bottom plate hole is offset relative the offset plate hole), pointing to the right when the probe is in free stage mode (i.e. the buckling beam is not under any vertical stress). The furthest offset of the bottom plate hole relative the offset plate hole is of the order of 0.035". This inhibits the probe beam from exiting as a straight beam in a no-load condition, because the beam now is slightly curved right above the top surface of the bottom plate. During test, the probe tip will make contact under a compressive stress exerted by the DUT (i.e., the wafer). Then the probe tip exit angle changes direction due to the manner the offset guide is positioned (i.e., the offset plate hole is offset to the right of the top plate, setting the buckling direction).

The spacer wall is constructed in such a manner that the probe beam can only buckle to the right because immediately below the offset plate, a solid wall on the left side prevents the beam from buckling to the left. Accordingly, the probe tip exit angle has to be changed. Under these conditions, the probe tip points to the left when the beam is buckling. This provides the probe with a wiping action. (Note: in practice, the actual scrub length achieved by these conditions is about 10 microns. Preferably, the probe tip used is needle shaped, with a radius of the tip of 12 microns).

Figure 4:
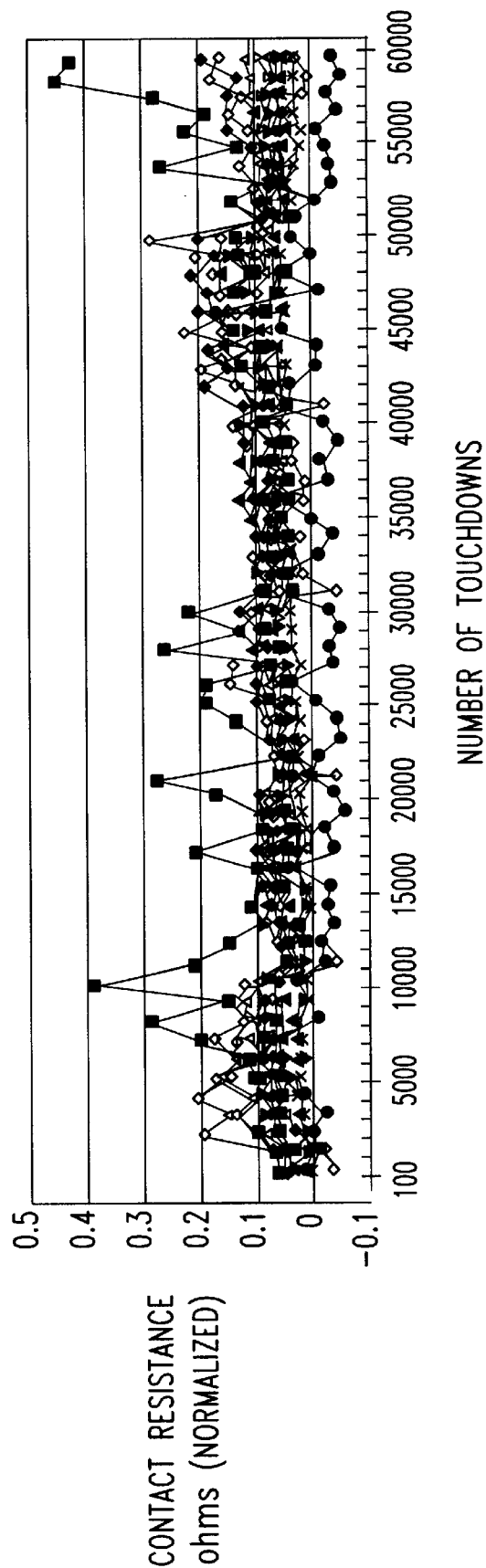
FIG. 4 is a plot showing the contact resistance versus the number of touchdowns for a self-scrub buckling beam making contact with Al pads on a wafer.

Referring now to FIG. 4, there is shown a plot of the variations of the contact resistance versus the number of touchdowns (also referred to as cycles). A touchdown represents the condition when the tester drives the probe down, allowing the probe contact the pads on the wafer. Resistance measurements are taken by the electronic within the tester. The plot shown in FIG. 3 applies to a self-scrub buckling beam making contact with Al pads on the wafer. The variations of the contact resistance span over 60K cycles, and were measured on a Sara tester, manufactured by Teradyne. The goal is to maintain the contact resistance to a very low level, preferably, below 0.5 ohms for 200k touchdowns, allowing cleaning only at a limited number of intervals, typically in the range of some 10 kcycles or one cleaning per 50 kcycles.

The results shown apply to a shifted self-scrub type having a 40 mil offset, and operating in a non-clean room in order to highlight the problem associated with dust particles and the way of handling the cleaning of the probe tip in such an environment. The control group and straight scrub exhibit inconsistent results similar to those observed in prior art readings. However, some of the probes in both the control group and straight scrub show "good" results even at 60 kcycles. At the end of 60 kcycles, only one probe reads above 0.5 ohm contact resistance, denoting that the probes have not been cleaned up to this point. Cleaning usually consists of lightly brushing off any contamination on the tip, preferably, with a soft camel hair brush.

The contact resistance (in ohms) shown in FIG. 4 is normalized with respect to the same probe operating on a gold pad used as a standard. More specifically, some five readings were first taken one a golden wafer for each channel. The lowest reading of the five measurements was recorded to a "normalized file" used as a base resistance reading on gold. The contact resistance on the vertical scale is based on measurements taken on the aluminum pads minus the resistance measured on the "normalized file", i.e., on the gold pads.

While the invention has been described in terms of a single preferred embodiment, those skilled in the art will recognize that the invention can be practiced with changes and modifications, which fall within the scope of the appended claims.

What is claimed is:

1. A buckling beam contactor for contacting an array of pads positioned on a device under test, comprising:

an upper, an offset and a lower plate with holes therein, each of the plates being distally separated from the next plate by a spacer, wherein the distance that separates the bottom of the offset plate and the top of the lower plate determines a critical buckling force that is dependent on a critical buckle length $L_{CR}$ separating the offset plate from the lower plate, $L_{CR}$ being determined by the equation:

$$L_{CR} = [(N\ p^2\ E\ I)/P_{CR}]^{1/2}$$

wherein

N is a coefficient dependent on end conditions of the wire,

E is a modulus of elasticity of the probe material,

I represents a moment of inertia of the probe, and $P_{CR}$ is a critical force that buckles a long wire; and an array of flexible wires positioned transversally to the plates, wherein each of the flexible wires cross a corresponding hole in the upper, offset and lower plates, each wire respectively contacting a pad of the device under test, wherein by shifting the center of the hole of the lower plate relative to the center of the offset plate, the tip of the wire exiting from the lower plate at an angle with respect to the plane formed by the pads of the device under test provides a controlling wiping movement.

2. The buckling beam contactor as recited in claim 1, wherein the exit angle of the wire tip is controlled by the relative displacement of the offset plate relative to the lower plate.

3. The buckling beam contactor as recited in claim 1, wherein a change of direction of the exit angle of the tip of the wire at the lower plate changes when the probe wire is under compression.

4. The buckling beam contactor as recited in claim 1, wherein the critical buckle distance separating the upper plate from the offset plate is determined by the amount of offset between the center of the hole positioned in the upper plate relative to the center of the corresponding hole in the offset plate.

5. The buckling beam contactor as recited in claim 1, wherein a reciprocating motion of the tip of the wire against a surface of the device under test provides a scrubbing motion that lowers the resistance between the pad of the device under test and the tip of the wire.

6. The buckling beam contactor as recited in claim 5, wherein a scrubbing motion of the tip of the wire is obtained by a compressive force exerted by device under test on tip of the wire.

7. The buckling beam contactor as recited in claim 5, wherein the scrubbing motion of the tip of the wire cleans the surface of the pad contacted by the wire tip.

8. The buckling beam contactor as recited in claim 5, wherein the scrubbing motion of the tip prevents contaminants from adhering to the tip of the wire.

9. A buckling beam contactor for contacting an array of pads positioned on a device under test, comprising:

an array of flexible conductive wires arranged in a formation that matches a footprint of the device under test, the flexible conductive wires positioned transversally to the device under test;

an upper, an offset and a lower insulating plate with holes therein, each of the plates being distally separated from the next plate by a spacer, the distance separating the bottom of the offset plate and the top of the lower plate determining a critical buckling force that is dependent on a critical buckle length $L_{CR}$ separating the offset plate from the lower plate, $L_{CR}$ being determined by the equation:

$$L_{CR} = [(N\, p^2\, E\, I)/P_{CR}]^{1/2}$$

wherein

N is a coefficient dependent on end conditions of the wire,

E is a modulus of elasticity of the probe material,

I represents a moment of inertia of the probe, and $P_{CR}$ is a critical force that buckles a long wire; and each of the flexible conductive wires crossing a corresponding hole in each of the upper, offset and lower plate to allow each of the flexible conductive wires respectively contact a pad of the device under test, wherein by shifting the position of the center of the hole of the lower plate relative to the position of the center of the offset plate, the tip of each of the flexible conductive wires exits from the lower plate at an angle with respect to the plane formed by the pads of the device under test, and wherein by further changing the angle in a reciprocating motion of the tips of the flexible conductive, a scrubbing action on the pads of the device under test is obtained.

10. A method of wiping an array of pads positioned on a device under test, the method comprising the steps of:

providing a buckling beam contactor comprising an upper, an offset and a lower plates with holes therein, each of the plates being distally separated from the next plate by a spacer, the distance separating the bottom of the offset plate and the top of the lower plate determining a critical buckling force that is dependent on a critical buckle length $L_{CR}$ separating the offset plate from the lower plate, $L_{CR}$ being determined by the equation:

$$L_{CR} = [(N\, p^2\, E\, I)/P_{CR}]^{1/2}$$

wherein

N is a coefficient dependent on end conditions of the wire,

E is a modulus of elasticity of the probe material,

I represents a moment of inertia of the probe, and $P_{CR}$ is a critical force that buckles a long wire; and providing an array of flexible wires positioned transversally to the plates, each of the flexible wires crossing a corresponding hole in each of the upper, offset and lower plate to allow each wire respectively contact a pad of the device under test, wherein by shifting the center of the hole of the lower plate relative to the center of the offset plate, the tip of the wire exits from the lower plate at an angle with respect to the plane formed by the pads of the device under test.

11. The method as recited in claim 10, wherein the exit angle of the wire tip is controlled by the relative displacement of the offset plate relative to the lower plate.

12. The method as recited in claim 10, wherein a change of direction of the exit angle of the tip of the wire at the lower plate changes when the probe wire is under compression.

13. The method as recited in claim 10, wherein a reciprocating motion of the tip of the wire against a surface of the device under test provides a scrubbing motion that lowers the resistance between the pad of the device under test and the tip of the wire.

14. The method as recited in claim 13, wherein the scrubbing motion of the tip of the wire is obtained by a compressive force exerted by device under test on tip of the wire.

15. The method as recited in claim 13, wherein the scrubbing motion of the tip of the wire cleans the surface of the pad contacted by the wire tip.

16. The method as recited in claim 13, wherein the scrubbing motion of the tip prevents contaminants from adhering to the tip of the wire.

* * * * *